United States Patent [19]

Ezaki et al.

[11] Patent Number: 5,102,279
[45] Date of Patent: Apr. 7, 1992

[54] CONTINUOUS VACUUM PROCESSING APPARATUS

[75] Inventors: Shinobu Ezaki, Ibaraki; Masaie Tokai, Ryugasaki, both of Japan

[73] Assignee: Hitachi, Ltd., Tokyo, Japan

[21] Appl. No.: 357,123

[22] Filed: May 26, 1989

[30] Foreign Application Priority Data

May 27, 1988 [JP] Japan .................. 63-128315

[51] Int. Cl.⁵ .................................. B65G 00/00
[52] U.S. Cl. .................................. 414/217; 118/719
[58] Field of Search ............... 414/217, 222; 204/165; 118/719, 50, 50.1

[56] References Cited

U.S. PATENT DOCUMENTS

| | | | |
|---|---|---|---|
| 2,384,500 | 9/1945 | Stoll | 118/719 X |
| 3,057,792 | 10/1962 | Fröhlich | 204/165 |
| 3,667,626 | 6/1972 | Torelli et al. | 414/217 |
| 4,664,951 | 5/1987 | Doehler | 118/719 X |
| 4,693,799 | 9/1987 | Yanagihara et al. | 204/165 |
| 4,797,054 | 1/1989 | Arii | 414/217 |

FOREIGN PATENT DOCUMENTS 62-4866 1/1987 Japan .

Primary Examiner—D. Glenn Dayoan
Assistant Examiner—Keith L. Dixon
Attorney, Agent, or Firm—Antonelli, Terry, Stout & Kraus

[57] ABSTRACT

A continuous vacuum processing apparatus has at least one preliminary vacuum chamber respectively disposed in front of and rear of a vacuum processing chamber. The preliminary vacuum chamber is provided with a slit-shaped seal for sealing the vacuum processing chamber from outside. The preliminary vacuum chamber which is located closest to the atmosphere is provided with an adjusting valve for adjusting the evacuation rate. Alternatively, the preliminary vacuum chamber which is located closest to the atmosphere is shorter that other preliminary vacuum chambers.

10 Claims, 7 Drawing Sheets

1

CONTINUOUS VACUUM PROCESSING APPARATUS

BACKGROUND OF THE INVENTION

The present invention relates to an apparatus for continuous processing an object to be processed under vacuum, such as, for example, an apparatus for continuous plasma processing or deposition processing on a plastics molded piece such as a polyethylene terephthalate (PET) film, natural or synthetic fibers or a steel plate to be coated.

In, for example, U.S. Pat. No. 3,057,792, a preliminary vacuum chamber of a vacuum processing apparatus is sealed by a slit-shaped sealing device, with another vacuum processing apparatus being proposed in the specification of Japanese Patent Laid-Open No. 62-4866, wherein each guide roll for guiding an object to be processed is provided in front of and rear of a slit-shaped sealing device for sealing a preliminary vacuum chamber.

SUMMARY OF THE INVENTION

An object of the present invention is to provide a continuous vacuum processing apparatus which is capable of preventing an object to be processed from being damaged by the contact of the object with a sealing portion of the apparatus.

To this end, the present invention provides a continuous vacuum processing apparatus which includes means for separately evacuating the upper and lower portions of the interior of each of preliminary vacuum chambers located closest to the atmosphere which are divided by an object to be processed and for adjusting the pumping speed thereof, and pressure detecting means for detecting the pressure in the preliminary vacuum chamber, the pressure detecting means sending a control signal to control means for controlling the pumping speed of the adjusting means.

The pressure detecting means may be replaced by air flow rate detecting means for detecting the flow rates of the air that flows in the sealing portions or position detecting means for detecting the position of the object to be processed.

In this way, the flow rate of air that flows into the upper and lower portions of the interior of each of the slit-shaped sealing portions closest to the atmosphere which are divided by the object can be separately adjusted by the pumping systems provided in each of the preliminary vacuum chambers located closest to the atmosphere. This enables the pressure difference generated by the flow rate of the air into the upper and lower portions and exerting on the upper and lower surfaces of the object to be eliminated, thereby preventing deformation, e.g., bending, of the object caused by the pressure difference. In consequence, the contact of the object with the sealing slit can be prevented, thereby preventing the damage to the object caused by the contact.

DESCRIPTION OF THE PREFERRED EMBODIMENTS

Figure 1:
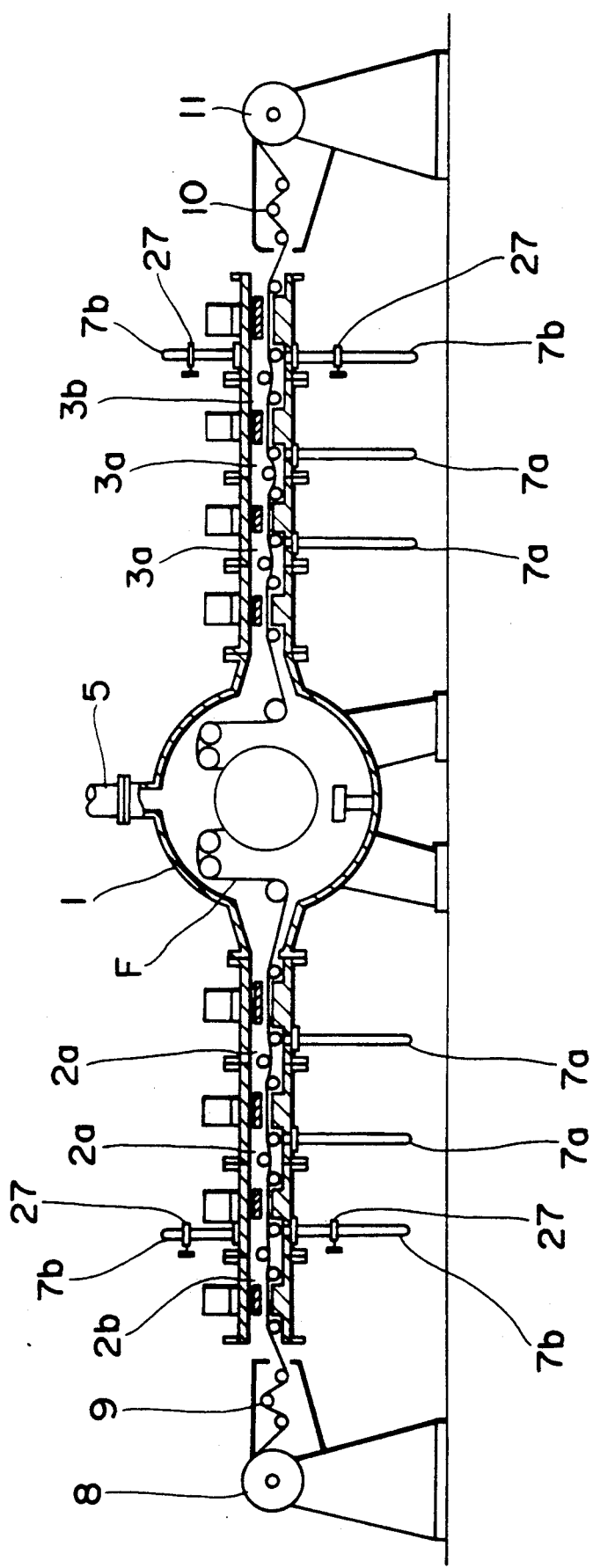
FIG. 1 is a cross-sectional view of a continuous vacuum processing apparatus, showing a first embodiment of the present invention.
Figure 2:
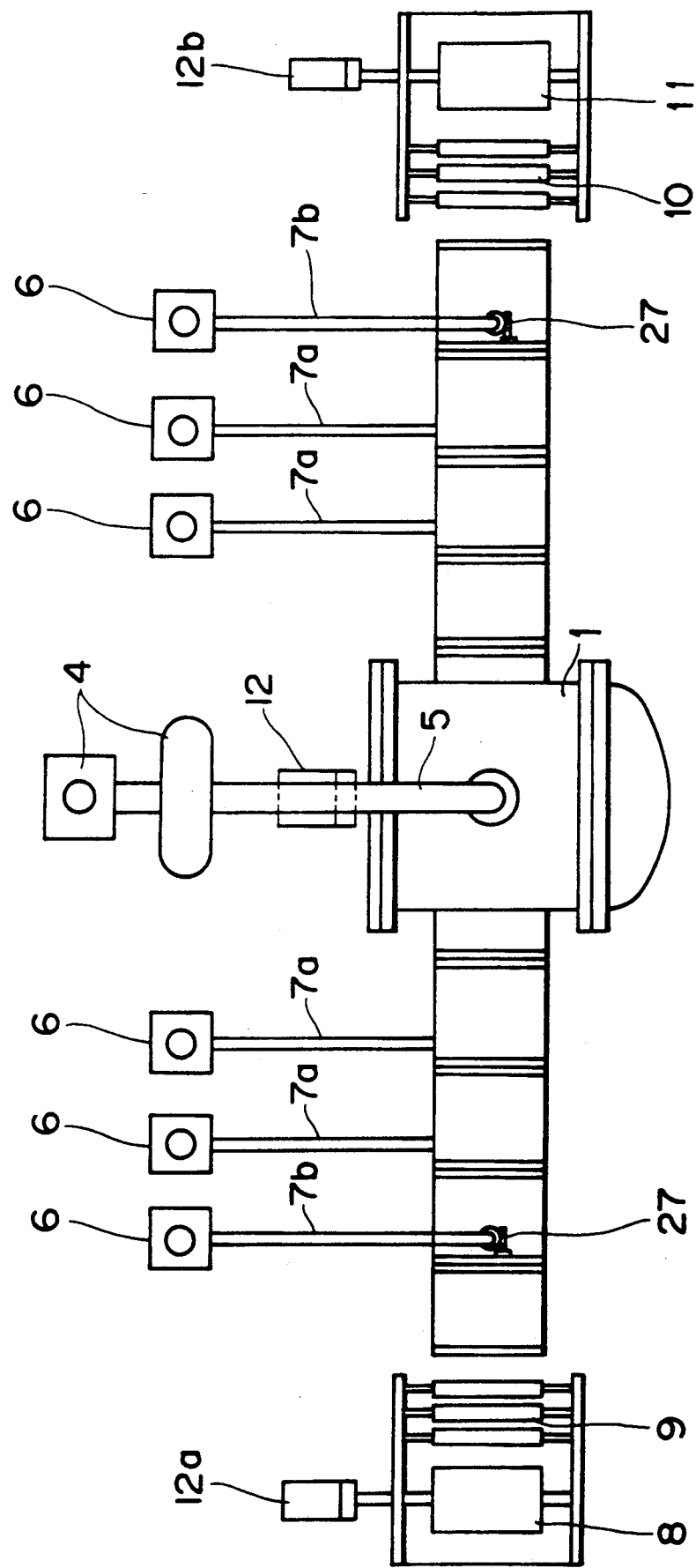
FIG. 2 is a plan view of the apparatus of FIG. 1.

Referring first to FIGS. 1 and 2, a vacuum processing chamber 1 is provided for a continuous plasma processing of a flexible object to be processed F, e.g., made of plastic film such as PET film, under vacuum. A plurality of preliminary vacuum chambers 2a and 2b are disposed in front of the vacuum processing chamber 1, and a plurality of preliminary vacuum chambers 3a and 3b are provided in rear of the vacuum processing chamber 1. The interior of the vacuum processing chamber 1 is pumped by a vacuum pump 4 connected thereto through an exhaust pipe 5 so that it is kept at a vacuum pressure of the order of $10^{-3}$ Torr.

The preliminary vacuum chambers 2a, 2b and 3a, 3b are pumped by each of the corresponding pumps 6 (see FIG. 2) through exhaust pipes 7a connected to the preliminary vacuum chambers 2a and 3a and exhaust pipes 7b connected to the preliminary vacuum chambers 2b and 3b so that the interiors of the individual preliminary vacuum chambers are kept at vacuum pressures which are higher than that in the vacuum processing chamber 1 and which decrease in steps. Each of the exhaust pipes 7b is provided with a vacuum valve 27 such as, for example, a throttle or butterfly valve, which is capable of adjusting the pumping speed. The exhaust pipes 7a and 7b together form an evacuation system. Hereinafter the space formed between an upper sealing portion and an object to be processed F is referred to as "an upper seal", and the space formed between a lower sealing portion and the object to be processed F is referred to as "a lower seal". A pressure difference generated between the upper and lower seals causes a force to be exerted on the object F to be processed, and the object thus deforms and further vibrates. As a result, the object F makes contact with the slit-shaped sealing portion and is thereby damaged. In embodiment of FIGS. 1 and 2, the pressure difference generated in the upper and lower seals is reduced to zero by suitably adjusting the amounts of air flowing into the upper and lower seals. These adjustments are accomplished by controlling the pumping speeds of each of the preliminary vacuum chambers 2b and 3b which are located closest to the atmosphere by the vacuum valves 27, e.g., the throttle or butterfly valves, provided in the exhaust pipes 7b. Consequently, the pressure in the upper seal becomes equal to that in the lower seal, and the damage to the object F caused by the contact of the object F with the slit-shaped sealing portion can be prevented. In this embodiment, the amount of air flowing only into the slit-shaped sealing portions closest to the atmosphere is adjusted, because the amount of air which flows into other slit-shaped sealing portions is smaller by far than that of the air flowing into those slit-shaped sealing portions and small enough not to generate any pressure difference.

The object F is fed out of an unwinding shaft 8, with tension of the object F being controlled by a guide roll 9. Thereafter, the object F passes through the preliminary vacuum chambers 2b and 2a, and is fed into the vacuum processing chamber 1 where it is plasma processed.

The object F which has been plasma processed is wound around a winding shaft 11 via the preliminary vacuum chambers 3a and 3b and a guide roll 10 disposed in rear of the preliminary vacuum chambers 3a and 3b for controlling the tension of the object F within the preliminary vacuum chambers 3a and 3b. The object F is conveyed by DC motors 12a and 12b, as shown in FIG. 2. Tension of the object F applied by the guide rolls 9 and 10 is detected so as to enable the object F to be conveyed without generating wrinkles and to enable the conveying speed to be appropriately controlled.

Figure 3:
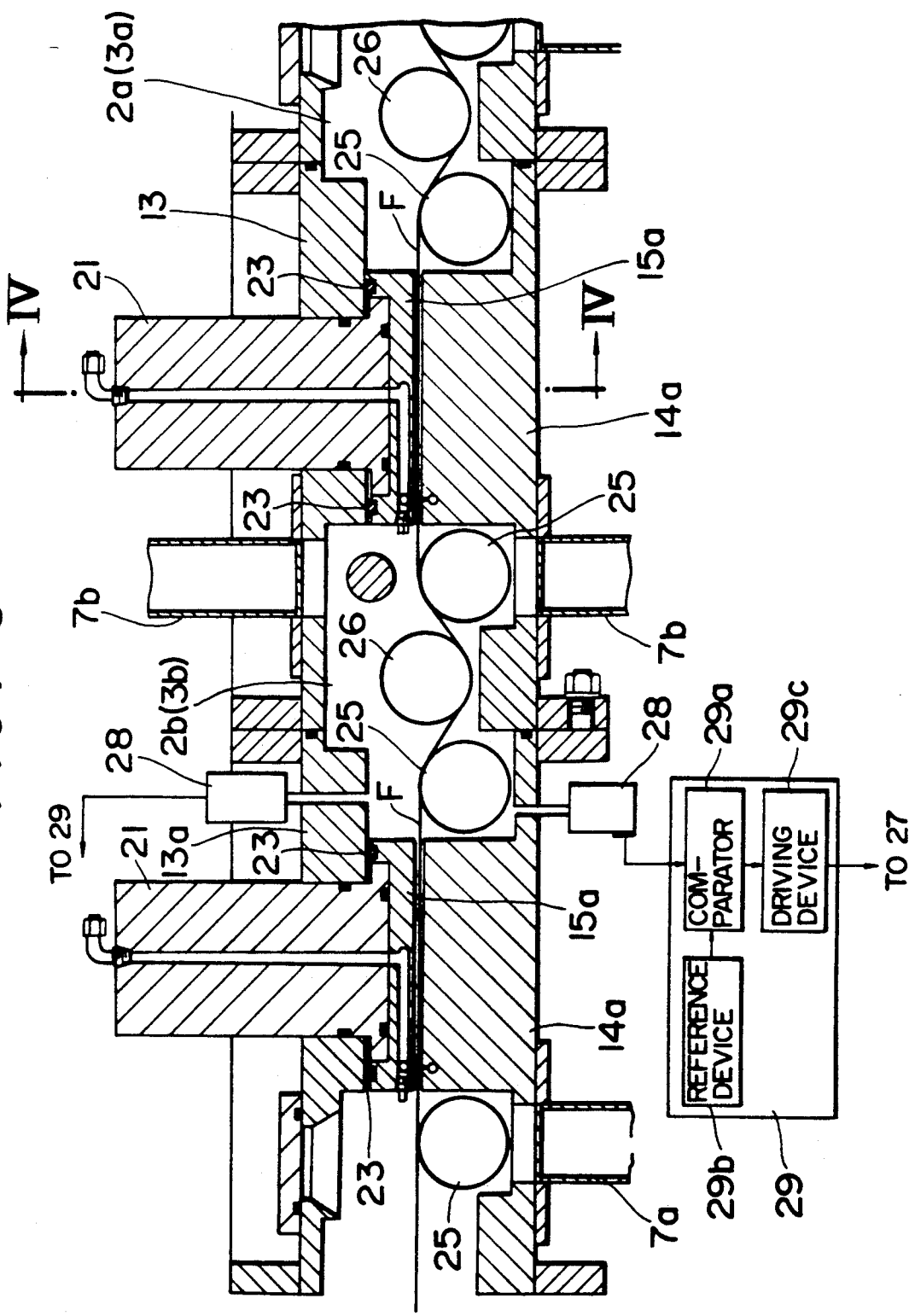
FIG. 3 is a cross-sectional view of portions of a sealing device.
Figure 4:
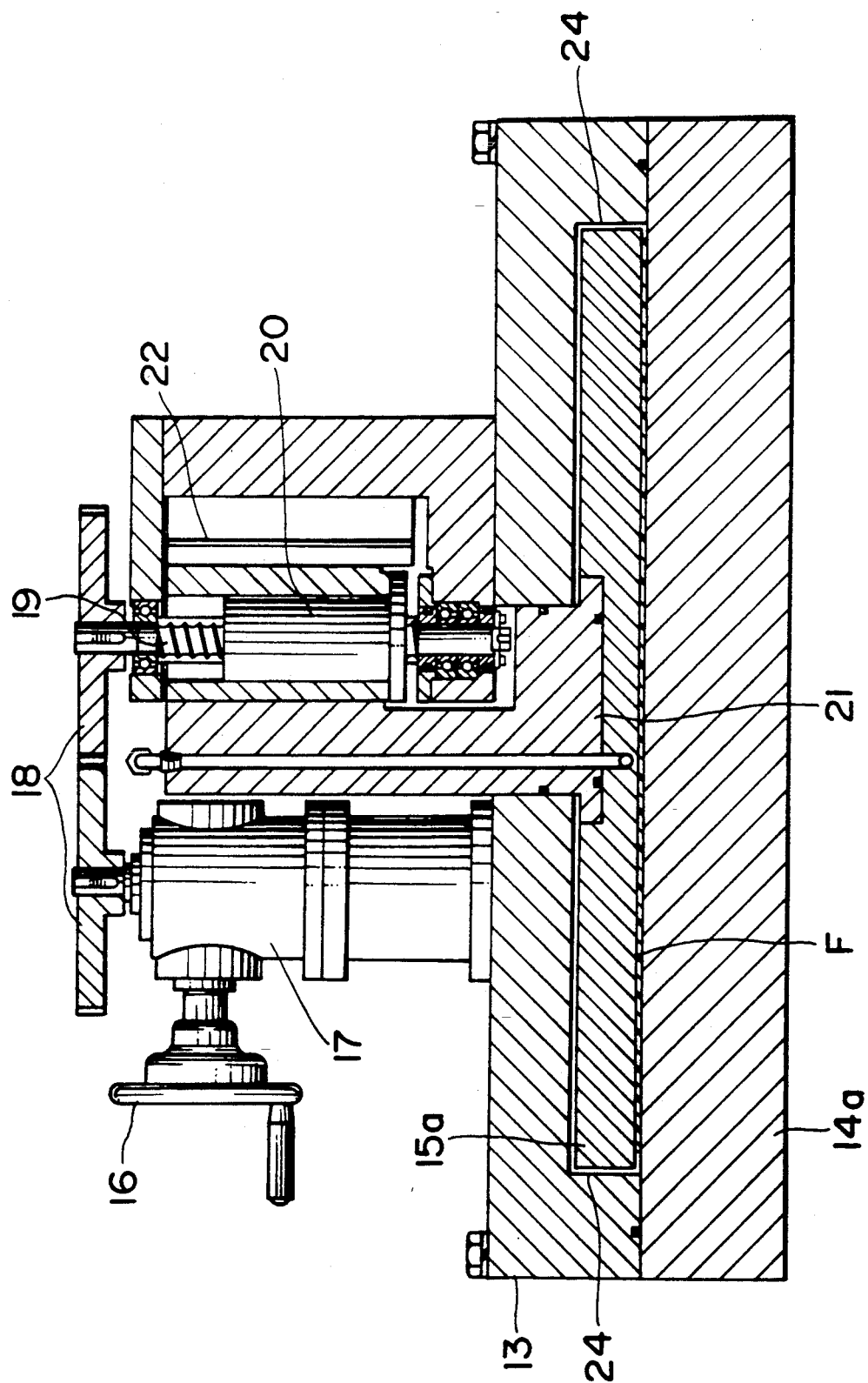
FIG. 4 is a sectional view taken along the line IV—IV of FIG. 3.

In FIG. 3, a sealing device constituting a preliminary vacuum chamber is formed by an upper casing 13a, a lower casing 14a, and a sealing block 15a supported by the upper casing 13a. The object F is conveyed in a slit formed by the lower casing 14a and the sealing block 15a in such a manner that the object F does not make contact with the lower casing 14a and the sealing block 15a. As shown in FIG. 4, a column 21 formed integrally with the sealing block 15a and the sealing block 15a are moved in the vertical direction in accordance with the thickness of the object F by the rotation of a handle 16. The rotation of the handle 16 is transmitted to the sealing block 15a through a reduction gear 17, gears 18, a ball screw 19 and a nut 20. The vertical movement of the sealing block 15a is guided by a guide 22. The space formed between the upper casing 13a and the sealing block 15a is sealed by O-rings 23. The O-rings 23 are of a sufficient elasticity to seal the space between the upper casing 13a and the sealing block 15a in order to move to vertical direction (maximum range is 2 mm) (see FIG. 3). Side gaps 24 between the upper casing 13a and the sealing block 15a are set to a value which ensures the smooth vertical movement of the sealing block 15a and that the amount of air leaking through the gaps can be minimized (it may be set to, for example, 30 microns). In FIG. 3, guide rolls 25 for guiding the object F are disposed in such a manner that the outer peripheral surfaces thereof are at a higher position than the lower casing 14a so as not to allow the object F brought into contact with the sealing surface of the lower casing 14a. Normally, the guide rolls 25 and the sealing block 15a are positioned so that both of the gap between the object F and the sealing block 15a and the gap between the object F and the lower casing are set to 0.1 mm. A tension applying roll 26 which also serves as a guide roll (hereinafter referred to simply as "a tension applying roll") can be moved in the vertical direction by a means (not shown). The tension applying roll 26 makes the object F contact the guide rolls 25 through a large contact angle, thus preventing the vibrations of the object F in the sealing portion and the resultant contact thereof with the wall of the sealing portion. The guide rolls 25 and the tension applying roll 26 in combination form a guide means. The sealing device of the preliminary vacuum chamber 2a or 3a corresponds to that of the preliminary vacuum chamber 2b or 3b. The preliminary vacuum chambers 2a, 2b or 3a, 3b are pumped by the vacuum pumps 6 through the exhaust pipes 7a and 7b. Pressure detecting means 28 are provided in the preliminary vacuum chamber 2b which is closest to the atmosphere. The detection signal from each of the pressure detecting means 28 is sent to a control means 29 for controlling the pumping speed through the vacuum valve 27. In practice, the pressure signal is input to a comparator 29a where it is compared with the reference signal from a reference device 29b. If it is detected that the pressure is higher than the reference value, a driving device 29c opens the vacuum valve 27 to reduce the pressure. Conversely, if the detected pressure is lower than the reference value, the vacuum valve 27 is closed to raise the pressure.

Such a pressure control is performed in the upper and lower portions of the preliminary vacuum chamber 2b divided by the object to the processed. Consequently, the pressure in the upper portion of the interior of the preliminary vacuum chamber 2b becomes equal to that in the lower portion, and the object F can be thereby conveyed without making contact with the sealing portion.

Figure 5:
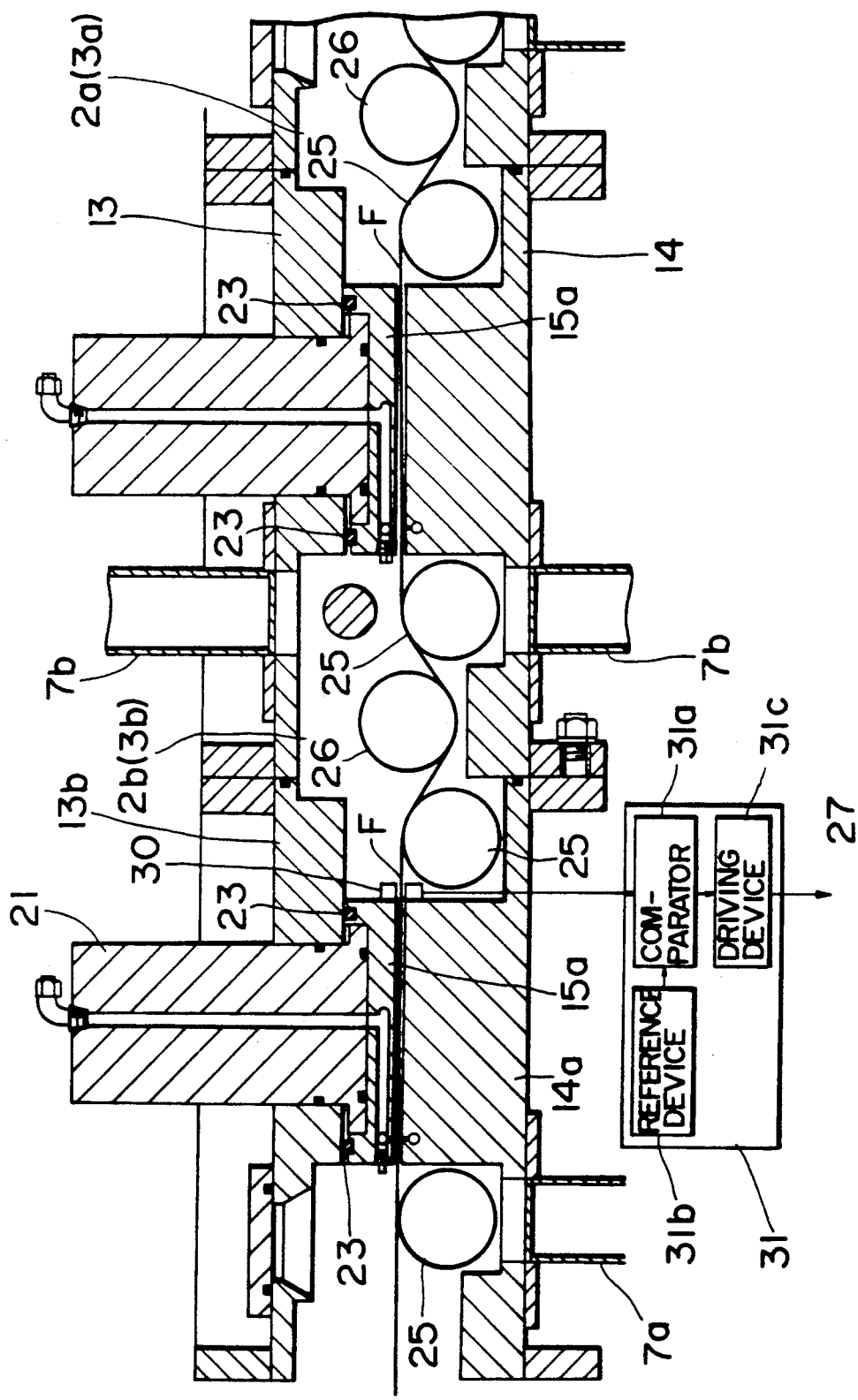
FIG. 5 is a cross-sectional view of portions of a sealing device, of a second embodiment of the present invention.

In FIG. 5, the object F is prevented from making contact with the sealing portion by detecting the position of the object F. The detection signal from position detection means 30 is sent to a control means 31 for controlling the pumping speed through the vacuum valve 27. Practically, the position signal of the object F is inputted to a comparator 31a where it is compared with the reference signal from a reference device 31b. If the position of the object F is higher than the reference value, a driving device 31c opens the vacuum valve 27 to reduce the pressure. Conversely, if the position of the object F is lower than the reference value, the vacuum valve 27 is closed to raise the pressure In this embodiment, the pressure in the upper portion of the interior of the preliminary vacuum chamber 2b becomes equal to that in the lower portion, and the object F can be thereby conveyed without making contact with the sealing portion, as in the case of the embodiment of FIGS. 1 and 2.

Figure 6:
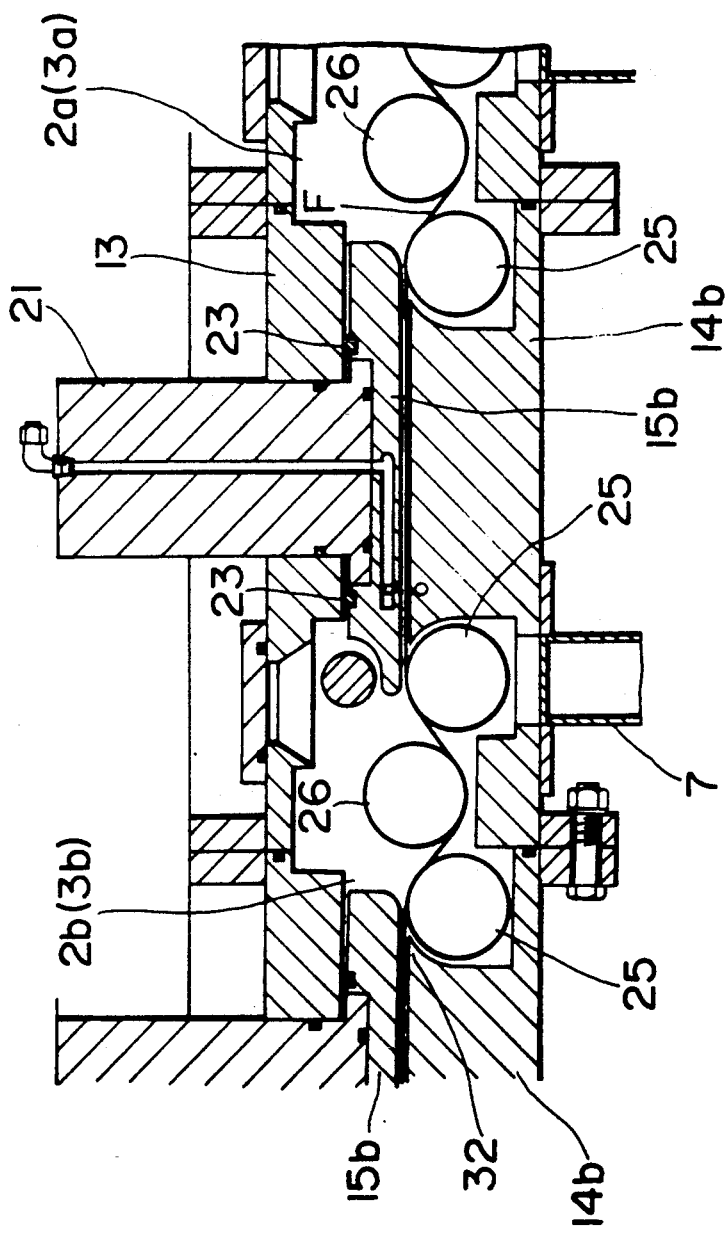
FIG. 6 is a cross-sectional view of portions of a sealing device of a third embodiment of the present invention.

In FIG. 6, the portions 32 of the casings 14b and the sealing blocks 15b which are located in the vicinity of the openings are extended along the outer peripheral surfaces of the guide rolls 25 and the object F. In this way, the distance between each of the contact points of the guide rolls 25 with the object F and the corresponding opening can be made shorter.

Further since the sealing blocks 15b extend to uppermost portions of the guide rolls 25, deformation of the object F caused by the expansion of the air in the upper portion of the interior of the preliminary vacuum chamber can be prevented.

Figure 7:
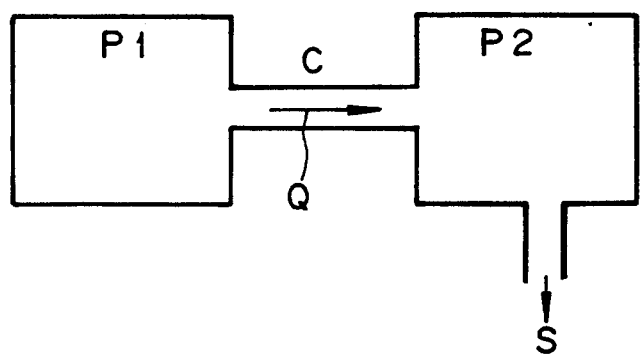
FIG. 7 is a schematic view illustrating a the flow rate obtained in a sealed portion.

In this embodiment, damage to the object F generated in a conventional sealing portion can be prevented. Furthermore, if the same sealing length is to be obtained, the overall size of the apparatus can be made small. The pressure difference generated between the atmosphere and the preliminary vacuum chambers 2b and 3b closest to the atmosphere is larger than that generated between the other preliminary vacuum chambers or between the preliminary vacuum chambers and the vacuum processing chamber 1. The flow rate of the air that flows through the sealing slit is determined by this pressure difference. Where P1 and P2 (P1>P2) are respectively the pressures obtained in front of and rear of a sealing slit, C is the conductance of the sealing slit, and S is the evacuation rate, as shown in FIG. 7, the flow rate Q of the air that flows through the sealing slit is obtained by the following equation:

$$Q = C(P1 - P2) = P2S.$$

As is apparent from the above equation, the larger the P1−P2, i.e., the pressure difference, the larger the flow rate in the sealing slit. This means that the possibility of the object F deforming or vibrating due to the flow of air in the sealing slits 2b and 3b that exhibit the maximum pressure difference is larger than that in other sealing slits, and that the object F readily makes contact with the sealing slit in the sealing slits 2b and 3b, resulting in damage thereto. In order to overcome this problem, the sealing slits 2b and 3b are made shorter than other sealing slits 2a and 3a so that the distance between the object guiding rolls disposed in front of and rear of each of the sealing slits 2b and 3b can be shortened so as to reduce the deformation and the amplitude of the object F.

In this embodiment, deformation and amplitude of the object F can be reduced, thereby preventing damage to the object F caused by the contact thereof with the sealing slit.

Furthermore in the embodiment shown in FIG. 3, the pressure detecting means provided above and below the object F may be replaced by air flow rate detecting means provided in the upper and lower seals for detecting the flow rate of the air.

What is claimed is:

1. In a continuous vacuum processing apparatus in which at least one preliminary vacuum chamber is respectively disposed in a front of and to a rear of a vacuum processing chamber, each of said preliminary vacuum chambers is provided with a slit-shaped seal through which an object to be processed is conveyed, said slit-shaped seal being capable of sealing said vacuum processing chamber from outside, a guide means for guiding said object to be processed is provided at least at one of the positions in front of and to a rear of said seal, the preliminary vacuum chamber located nearest to atmosphere is provided with adjusting means for adjusting a pumping speed, detecting means are provided for detecting a flow rate of air flowing through upper and lower portions of an interior of said preliminary vacuum chamber divided by said object, and control means are provided for controlling the pumping speed of said adjusting means in accordance with a difference in a flow rate generated in said upper and lower portions of said preliminary vacuum chamber.

2. In a continuous vacuum processing apparatus in which at least one preliminary vacuum chamber is respectively disposed in front of and to a rear of a vacuum processing chamber, each of said preliminary vacuum chambers is provided with a slit-shaped sealing device through which an object to be processed is conveyed, said slit-shaped sealing device being capable of sealing said vacuum processing chamber from outside, a guide means are provided for guiding said object to be processed at positions in front of and to a rear of said sealing device, and portions of said slit-shaped sealing device located in a vicinity of openings are extended along an outer peripheral surface of said guide means and over and above said guide means along said object to be processed.

3. A continuous vacuum processing apparatus according to one of claims 1 or 2, wherein said guide means includes guide rolls disposed in a zigzag fashion.

4. In a continuous vacuum processing apparatus in which at least one preliminary vacuum chamber is respectively disposed in front of and to a rear of a vacuum processing chamber, each of said preliminary vacuum chambers includes slit-shaped seals provided in front of and to a rear of said preliminary vacuum chamber, a plurality of guide means are provided for guiding an object to be processed at positions in front of and to a rear of said seal, and the slit-shaped seal located nearest to atmosphere has a shorter length than a length of the other slit-shaped seals.

5. In a continuous vacuum processing apparatus in which at least one preliminary vacuum chamber is respectively disposed in a front of and to a rear of a vacuum processing chamber, each of said preliminary vacuum chambers includes slit-shaped seals provided in front of and to a rear of said preliminary vacuum chamber, a plurality of guide means are provided for guiding said object to be processed to positions in front of and to a rear of said seal, the slit-shaped seal which is located nearest to atmosphere has a shorter length than a length of the other slit-shaped seals, and the preliminary vacuum chamber associated with the slit-shaped seal having the shorter length provided with adjusting means for adjusting an evacuation rate.

6. In a continuous vacuum processing apparatus in which at least one preliminary vacuum chamber is respectively disposed in front of and to a rear of a vacuum processing chamber, each of said preliminary vacuum chambers includes slit-shaped seals provided in front of and to a rear of said preliminary vacuum chamber, the slit-shaped seal located nearest to atmosphere has a shorter length than a length of the other slit-shaped seals, the preliminary vacuum chamber associated with the slit-shaped seal having the shorter length is provided with adjusting means for adjusting a pumping speed, a plurality of guide means are provided for guiding an object to be processed at positions in front and to a rear of said seals, detecting means are provided for detecting pressure in upper and lower portions of an interior of said preliminary vacuum chamber divided by the object to be processed, and control means are provided for controlling the pumping speeds of said adjusting means in accordance with the pressure difference generated in said upper and lower portions of said preliminary vacuum chamber.

7. In a continuous vacuum processing apparatus in which at least one preliminary vacuum chamber is respectively disposed in a front of and to a rear of a vacuum processing chamber, each of said preliminary vacuum chambers includes slit-shaped seals provided in front of and to a rear of said preliminary vacuum chamber, the slit-shaped seal located nearest to atmosphere has a shorter length than length of the other slit-shaped seals, the preliminary vacuum chamber associated with the slit-shaped seal having the shorter length is provided with adjusting means for adjusting a pumping speed, detecting means are provided for detecting the flow rate of air flowing through upper and lower portions of an interior of said of the preliminary vacuum chamber divided by an object to be processed, and control means are provided for controlling the pumping speed of said adjusting means in accordance with a difference in a flow rate generated in said upper and lower portions of said preliminary vacuum chamber.

8. In a continuous vacuum processing apparatus in which at least one preliminary vacuum chamber is respectively disposed in front of and to a rear of a vacuum processing chamber, each of said preliminary vacuum chambers includes slit-shaped seals provided in front of and to the rear of said preliminary vacuum chamber, the slit-shaped seals nearest to atmosphere has a shorter length than a length of the other slit-shaped seals, the preliminary vacuum chamber associated with the slit-shaped seal having the shorter length is provided with adjusting means for adjusting the evacuation rate, a plurality of guide means are provided for guiding an object to be processed provided at positions in front of and to a rear of said slit-shaped seals, detecting means are provided for detecting the position of the object to be processed, and control means are provided for controlling evacuation rates of said adjusting means in accordance with the position of said object.

9. In a continuous vacuum processing apparatus in which at least one preliminary vacuum chamber is respectively disposed in front of and to a rear of a vacuum processing chamber, each of said preliminary vacuum chambers is provided with a slit-shaped seal through which an object to be processed is conveyed, said slit-shaped seal being capable of sealing said vacuum processing chamber from outside, the preliminary vacuum chamber located nearest to atmosphere is provided with adjusting means for adjusting a pumping speed, detecting means are provided for detecting vacuum pressure in upper and lower portions of an interior of said preliminary vacuum chamber divided by said object, and control means are provided for controlling the pumping speed of said adjusting means in accordance with a vacuum pressure difference generated in said upper and lower portions of said preliminary vacuum chamber.

10. In a continuous vacuum processing apparatus in which at least one preliminary vacuum chamber is respectively disposed in front of and to a rear of a vacuum processing chamber, each of said preliminary vacuum chambers is provided with a slit-shaped seal through which an object to be processed is conveyed, said slit-shaped seal being capable of sealing said vacuum processing chamber from outside, the preliminary vacuum chamber located nearest to atmosphere is provided with adjusting means for adjusting a pumping speed, detecting means are provided for detecting the flow rate of air flowing through upper and lower portions of an interior of said preliminary vacuum chamber divided by said object, and control means for controlling the pumping speed of said adjusting means in accordance with a difference in the flow rate generated in said upper and lower portions of said preliminary vacuum chamber.

* * * * *